US006244812B1

(12) United States Patent
Patterson et al.

(10) Patent No.: US 6,244,812 B1
(45) Date of Patent: Jun. 12, 2001

(54) LOW PROFILE AUTOMATED POD DOOR REMOVAL SYSTEM

(75) Inventors: Jesse Patterson, Santa Clara; Charles Thomas Dill, San Jose, both of CA (US)

(73) Assignee: H-Square Corporation, Sunnyvale, CA (US)

( * ) Notice: Subject to any disclaimer, the term of this patent is extended or adjusted under 35 U.S.C. 154(b) by 0 days.

(21) Appl. No.: 09/350,085

(22) Filed: Jul. 8, 1999

Related U.S. Application Data
(60) Provisional application No. 60/092,336, filed on Jul. 10, 1998.

(51) Int. Cl.[7] .................................................... B65G 49/07
(52) U.S. Cl. .................. 414/416; 414/217.1; 414/684.3; 414/937; 414/939; 118/719
(58) Field of Search ...................................... 414/779, 783, 414/217, 222.04, 222.05, 404, 416, 684.3, 742, 728, 811, 806, 805, 935, 937, 939, 940, 941, 217.1; 118/719; 432/239; 110/176; 202/262

(56) References Cited
U.S. PATENT DOCUMENTS

| 4,449,885 | | 5/1984 | Hertel et al. ......................... 414/750 |
|---|---|---|---|
| 4,846,625 | * | 7/1989 | Gabillet ............................. 414/728 X |
| 4,884,938 | * | 12/1989 | Fujita et al. ....................... 414/684.3 |
| 5,280,983 | * | 1/1994 | Maydan et al. .................. 414/416 X |
| 5,653,565 | | 8/1997 | Bonora et al. ......................... 414/411 |
| 5,711,427 | | 1/1998 | Nyseth ................................. 206/710 |
| 6,013,920 | * | 1/2000 | Gordon et al. ................... 414/937 X |
| 6,053,688 | * | 4/2000 | Cheng .............................. 414/937 X |
| 6,068,668 | * | 5/2000 | Mastroianni ..................... 414/937 X |
| 6,071,059 | * | 6/2000 | Maqes .............................. 414/937 X |

FOREIGN PATENT DOCUMENTS

456685 * 2/1928 (DE) .................................. 414/684.3

* cited by examiner

Primary Examiner—Frank E. Werner
(74) Attorney, Agent, or Firm—Terry McHugh

(57) ABSTRACT

An automated door removal and replacement system utilizes a combination of linear and rotational drive to remove a door of a wafer supporting device and store the door below the device. In one embodiment, the wafer-supporting device is a Front Opening Unified Pod (FOUP). A door-contacting assembly is pivotally mounted to include a horizontal rest position and a vertical unlocking position. In the horizontal rest position, the assembly resides below the wafer-supporting device. The assembly is rotated to a vertical position and then linearly moved to engage the door. Keys of the assembly are manipulated to release the door. The assembly and the door are moved rearwardly and the assembly is pivoted to the rest position, clearing the opening to the wafer-supporting device.

14 Claims, 8 Drawing Sheets

LOW PROFILE AUTOMATED POD DOOR REMOVAL SYSTEM

REFERENCE TO RELATED APPLICATION

This application claims the benefit of U.S. Provisional Application No. 60/092,336 of Patterson et al., filed Jul. 10, 1998.

TECHNICAL FIELD

The invention relates generally to systems for handling wafer supporting devices and more particularly to systems for automatically removing and reattaching a door of a device for storing an array of semiconductor wafers.

BACKGROUND ART

Wafer transfer systems are used to provide an automated transfer of semiconductor wafers from one position to another position. For example, the wafers contained in a cassette may be moved individually to a processing chamber for depositing and patterning layers of material for forming integrated circuit chips. Robotic handling devices are preferred, since human handling is more likely to cause contamination.

Conventional cassettes include slots that support the wafers in a vertical orientation. The wafers are removed from a cassette by lifting the wafers through an open top portion of the cassette. An automated transfer system that may be used to move semiconductor wafers between a cassette and a processing chamber is described in U.S. Pat. No. 4,449,885 to Hertel et al. The transfer system of Hertel et al. includes a cassette conveyor assembly for moving one or more cassettes horizontally. An elevator blade passes upwardly through the cassette to contact a lower edge of a wafer that has been moved into place by the conveyor assembly. The wafer is then raised to a position in which the elevator blade transfers the wafer to a vacuum chuck of a processing chamber. When the processing of the wafer has been completed, the wafer is returned to the cassette by the elevator blade.

Another type of wafer storage device is referred to as a Standardized Mechanical InterFace (SMIF) pod. A SMIF pod is described in U.S. Pat. No. 5,653,565 to Bonora et al. The wafers are held in a horizontal orientation, rather than a vertical orientation. The Bonora et al. patent describes a typical SMIF system as having three main components: (1) a sealed pod for storing and transporting cassettes that hold the semiconductor wafers; (2) enclosures placed over the cassette ports and wafer processing areas of processing equipment, so that the environments within the pods and the enclosures become miniature clean spaces; and (3) a transfer mechanism to load and unload wafers from the sealed pod without contamination of the wafers. In operation, when the semiconductor wafers are being transferred into the processing equipment, the pod is loaded onto an access port along an upper horizontal surface of the processing equipment. The pod door and the access port are preferably opened simultaneously, so that the exposure of the wafers to particles is minimized. An elevator lowers the pod door and the door of the access port, with the cassette riding on the pod door into the processing chamber. Thus, the wafers are removed from the pod in a protected manner.

Another type of wafer container is described in U.S. Pat. No. 5,711,427 to Nyseth. The Nyseth wafer container is described for use with 300 mm diameter semiconductor wafers. The container is sometimes referred to in the industry as a Front Opening Unified Pod (FOUP), since the wafers are stored in a horizontal orientation and the access door to the pod is located on a side that is perpendicular to the horizontally stored wafers. Automated transfer systems for use with FOUPs have been designed. The transfer systems are significantly different than the systems used with other types of containers, since the door is vertically mounted and the wafers are horizontally stored.

Typically, the access door of the FOUP includes a latching mechanism to ensure that the door remains in place until removal or insertion of wafers into the pod is desired. Devices for automatically removing the access door are known. Such devices typically rest on the floor adjacent to the equipment on which the FOUP is rested. A mechanism rises along guide rails to the access door and unlatches the door. The mechanism is then lowered to a rest position. One concern with such a device is that it requires stand-alone automated equipment to accommodate the movement of the door-removal mechanism. This may be undesirable in some applications. Another concern is that the extended movement of the door-removal mechanism may promote the generation of particles, since motors or other drive devices must be used in the operation of the mechanism. This is undesirable in an environment in which semiconductor wafers are to be exposed.

What is needed is a system for manipulating an access door of a wafer-supporting device such that system real estate requirements and the risk of generating particles are low.

SUMMARY OF THE INVENTION

An automated door removal and replacement system may have a small profile and a small horizontal space requirement by utilizing a combination of linear and rotational drive to contact a door, remove the door, and then store the door below a wafer-supporting device from which the door was removed. In the preferred embodiment, the system is used with a wafer-supporting device having horizontally oriented wafers and a vertical door. A door-contacting assembly is pivotally mounted to include a horizontal rest position and a vertical unlocking position. In applications in which the wafer-supporting device includes a latching mechanism, the door-contacting assembly includes keys aligned and configured to latch and unlatch the door.

In one application, unlocking a door of a wafer-supporting device includes a rotational motion followed by a linear motion. The door-contacting assembly swings from below the wafer-supporting device to the upright position. The assembly then moves horizontally to contact the door of the device. Where applicable, the horizontal movement inserts the latching/unlatching keys into the appropriate locations on the door. Often, the keys must be manipulated to release the door from the wafer-handling device, but this depends upon the type of device. For example, removal of the door of a FOUP requires that the keys be rotated approximately 90°. This rotation may be achieved by activating one or more electrically activated members, such as solenoids within the door-contacting assembly.

After the door has been properly engaged by the door-contacting assembly, the assembly is moved linearly away from the wafer-supporting device. This provides proper clearance for rotating the assembly to the lowered position in which the door resides below the wafer-supporting device. In this position, the door is generally horizontal. Thus, the storage space is less than would be required if the door were to be stored vertically.

Following the insertion or removal of wafers from the device, he door can be replaced by following the same steps, but in reverse order. hat is, the door-contacting assembly and the door are rotated to an upright condition in alignment with the front opening of the wafer-supporting device. The assembly is moved linearly to position the door within the opening of the device. The door is again latched and released from the door-contacting assembly. The assembly is returned to its rest position, allowing the device to be removed from the system.

An advantage of the invention is that the rotation of the door-contacting assembly conserves real estate. Much of the structure for automatically removing and replacing the door can be immediately below the wafer-supporting device. Thus, horizontal real estate requirements are relatively low. Moreover, by pivoting the door to a horizontal position, the system may have a relatively low profile, i.e., the vertical real estate requirements are low. There is no extended movement of the door-contacting assembly comparable to the movement along vertical guide rails of the type utilized in some prior art systems for removing doors from wafer-supporting devices.

While the system is designed primarily for front opening devices, such as FOUPs, there are advantages to using the system for automatically removing and returning doors of top-opening devices. For example, rather than a 90° pivot of the door-opening assembly from the horizontal rest position to the vertical contact position, the pivot may be extended to 180°. The linear motion to contact the door within such an application would need to be a downward movement. After unlatching the door, the assembly would be moved upwardly prior to a rotation of 180° to the horizontal rest position.

BEST MODE FOR CARRYING OUT THE INVENTION

Figure 1:
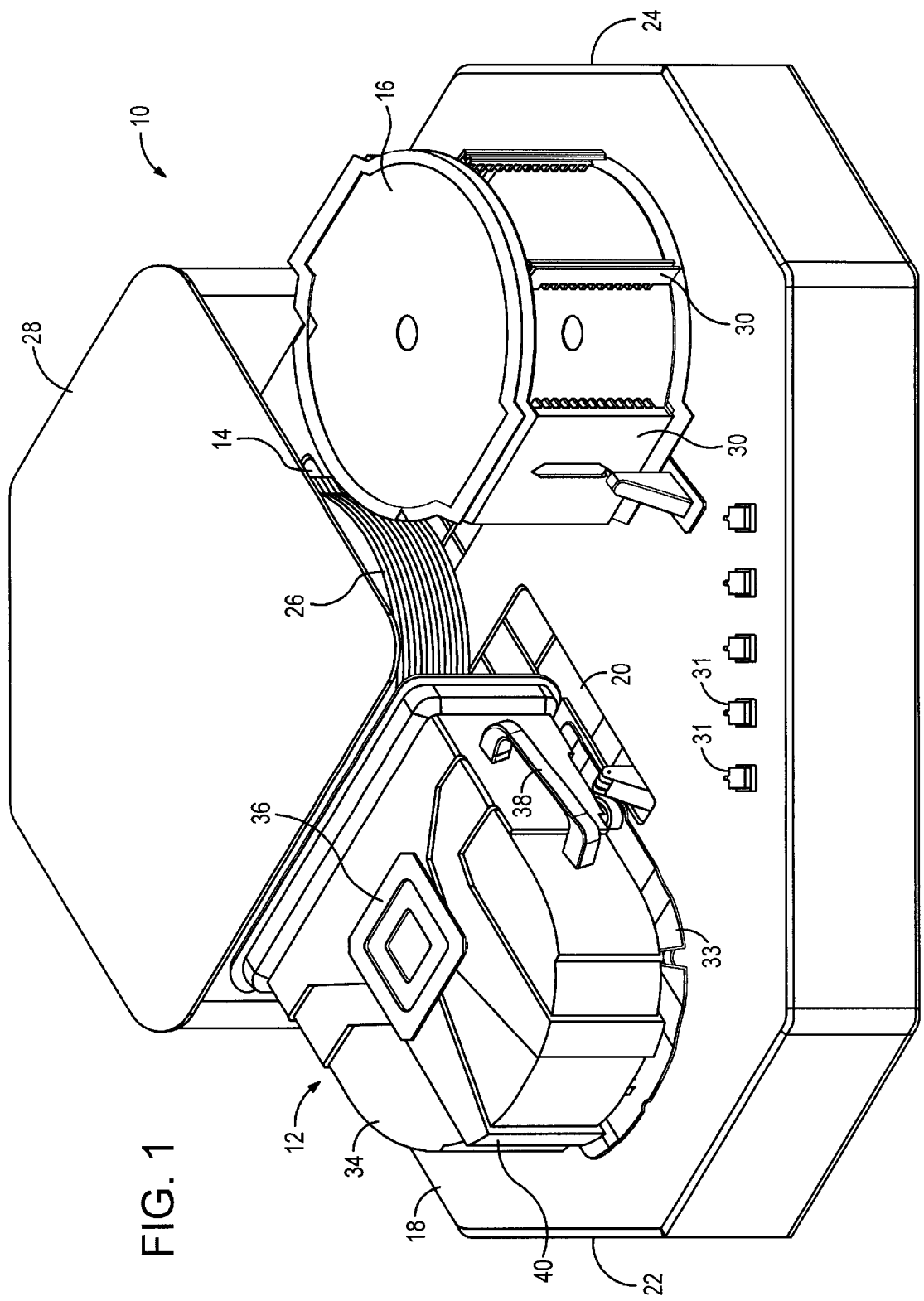
FIG. 1 is perspective view of a wafer transfer system that includes an automated door removal system in accordance with the invention.

With reference to FIG. 1, a wafer transfer system 10 is shown as including a Front Opening Unified Pod (FOUP) 12 having a front opening that faces a wafer-handling device 14 for exchanging wafers between the FOUP and a removable cassette 16. The operation of the handling device and the inclusion of the cassette are not critical to the invention.

The transfer system 10 includes a base unit 18 with an upper opening 20 that is aligned with the bottom of the FOUP 12. As will be explained in detail below, the system includes a mechanism for removing the front door of the FOUP and lowering the front door into the base unit. The door is automatically unlocked, pivoted to a position below the FOUP, and supported in a horizontal rest position that allows the vertical and horizontal space requirements of the door removal system to remain low. For example, the base unit of FIG. 1 may have a height of approximately 13.3 cm (5.25 inches). The greatest distance between two of the opposed walls 22 and 24 of the base unit may be approximately 1.003 meters (39.5 inches).

When the door of the FOUP 12 is removed, the wafer-handling device 14 can be displaced horizontally toward the FOUP. The handling device includes support rods that extend between adjacent semiconductor wafers within the pod 12. The handling device then lifts the wafers in unison and moves rearwardly to the position shown in FIG. 1. Twelve semiconductor wafers 26 are shown in the figure, but FOUPs typically have a capacity of either thirteen or twenty-five wafers.

A cover 28 protects the wafers 26 from falling particles when the wafers are removed from the pod 12. The handling device 14 pivots 90° under the protection of the cover 28, so that the handling device is aligned with the cassette 16. Horizontal displacement of the handling device moves the wafers into the cassette 16. The cassette includes comb-like structures 30 that define slots for receiving the wafers. The slots have the same pitch as slots within the pod 12 and the same pitch as the support rods of the wafer-handling device 14. Consequently, the handling device may be used to efficiently move the wafers from the pod to the cassette. Alternatively, the wafers may be moved from the cassette to the pod. Moreover, the cassette may be replaced with a processing chamber and the handling device may be replaced with a robotic member that removes the wafers from the pod in a one-by-one sequence. That is, operation of the automated pod door removal system to be described below is not restricted to the wafer transfer system 10 of FIG. 1.

The automated operations of the wafer transfer system 10 may be triggered by depressing switches 31 of a control panel at the upper plate of the base unit 18. For example, the first switch may be used to activate the automated pod door removal system, while the second switch may cause the wafer handling device 14 to enter the pod 12. The pod may be identical to the one described in U.S. Pat. No. 5,711,427 to Nyseth. The pod includes a base portion 33 and a cover portion 34, and is dimensioned to store 300 mm diameter semiconductor wafers. The base portion is configured to be kinematically coupled to the transfer system 10. The coupling mechanism is not shown in FIG. 1. Extending from the cover portion 34 is an interface structure 36 that is used to releasably connect the pod to other types of transfer systems. The pod also includes handles 38 connected at opposite sides of the sidewall of the pod. None of these external structures is critical to the invention.

Figure 2:
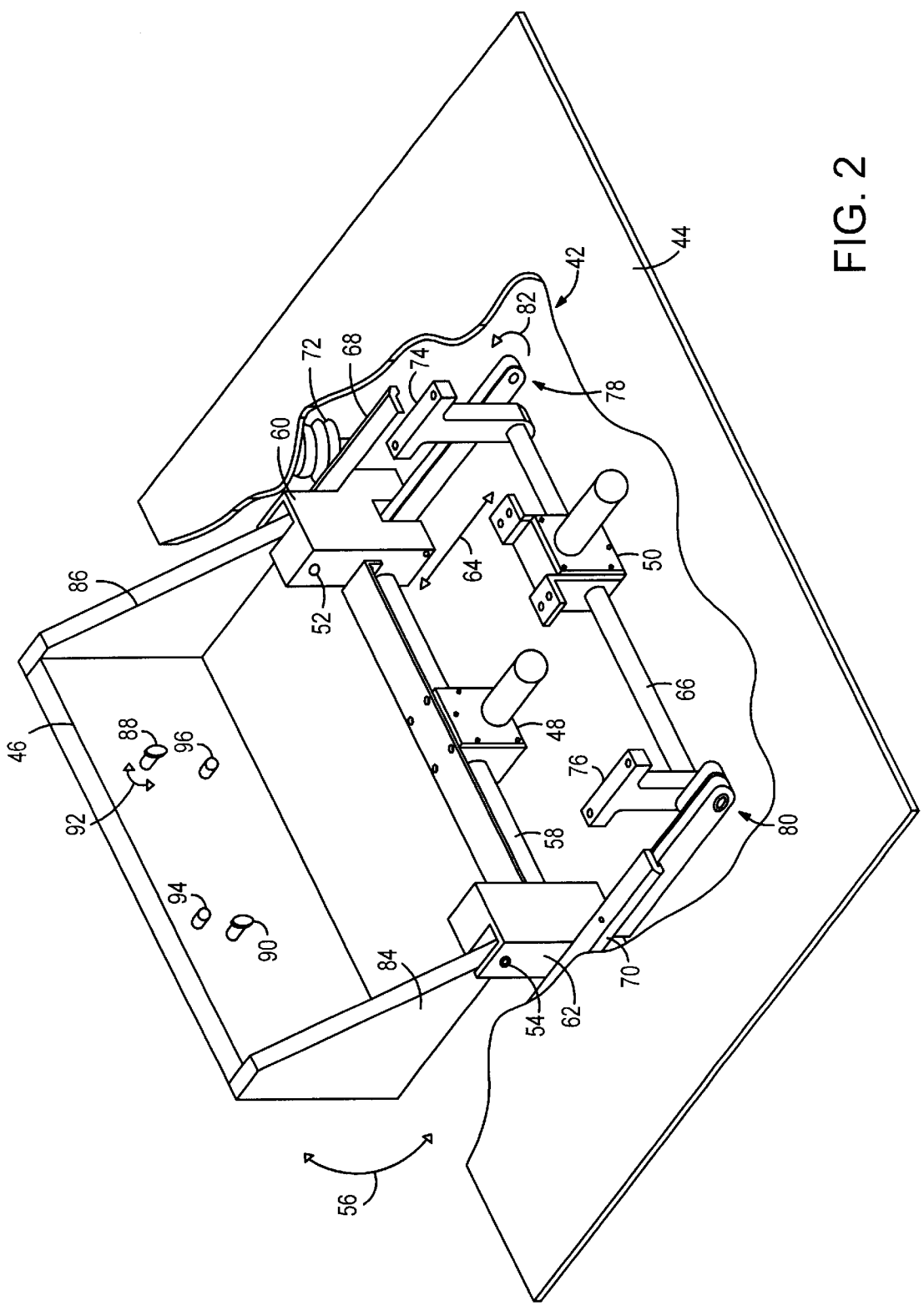
FIG. 2 is a simplified perspective view of the door removal system of FIG. 1.

Referring now to FIG. 2, a simplified version of an automated pod door removal system 42 is shown as being mounted to a base plate 44. The system includes a door-contacting assembly 46 that is coupled to a rotational drive mechanism 48 and a linear drive mechanism 50. Operation of the rotational drive mechanism 48 rotates the door-contacting assembly 46 about pivot points 52 and 54, as indicated by arrow 56. The rotational drive mechanism rotates a shaft 58, and this rotation is transferred to the assembly 46 by means of coupling gears or the like within mounts 60 and 62 to which the assembly is connected at the pivot points.

The operation of the linear drive mechanism 50 provides horizontal movement of the mounts 60 and 62 and the door-contacting assembly 46, as indicated by arrow 64. The linear drive mechanism causes rotation of a second shaft 66. The rotation of the shaft is translated into linear motion of a pair of tracks 68 and 70 along fixed guide wheels 72, only one of which is shown in FIG. 2. The second shaft 66 is rotatably coupled to mounting brackets 74 and 76 that are fixed to the base plate 74. Coupling structure 78 and 80 at the ends of the second shaft 66 cause rotational movement that is indicated by arrow 82. The long arms of the coupling structures 78 and 80 are connected to the mounts 60 and 62, but the tracks 68 and 70 and the guide wheels 72 limit movement of the mounts to horizontal displacement.

The door-contacting assembly 46 includes side arms 84 and 86 and a pair of keys 88 and 90. The keys are used to engage and release the door that is to be removed from or returned to the wafer-supporting device. The operation and locations of the keys depend upon the type of wafer-supporting device. If the device is a FOUP, the keys should be rotatable by 90°, as indicated by arrow 92. The rotation of the keys in one direction releases the door, while rotation in the opposite direction latches the door to the FOUP. Pins 94 and 96 may be included to control contact of the assembly 46 to the door.

For applications in which the keys 88 and 90 are to be rotated to latch and unlatch the door, the mechanism for causing rotation is not critical. Preferably, at least one electrically activated member is used to latch and unlatch the door. In one application, the rotation is initiated by solenoid action, not shown.

Figure 3:
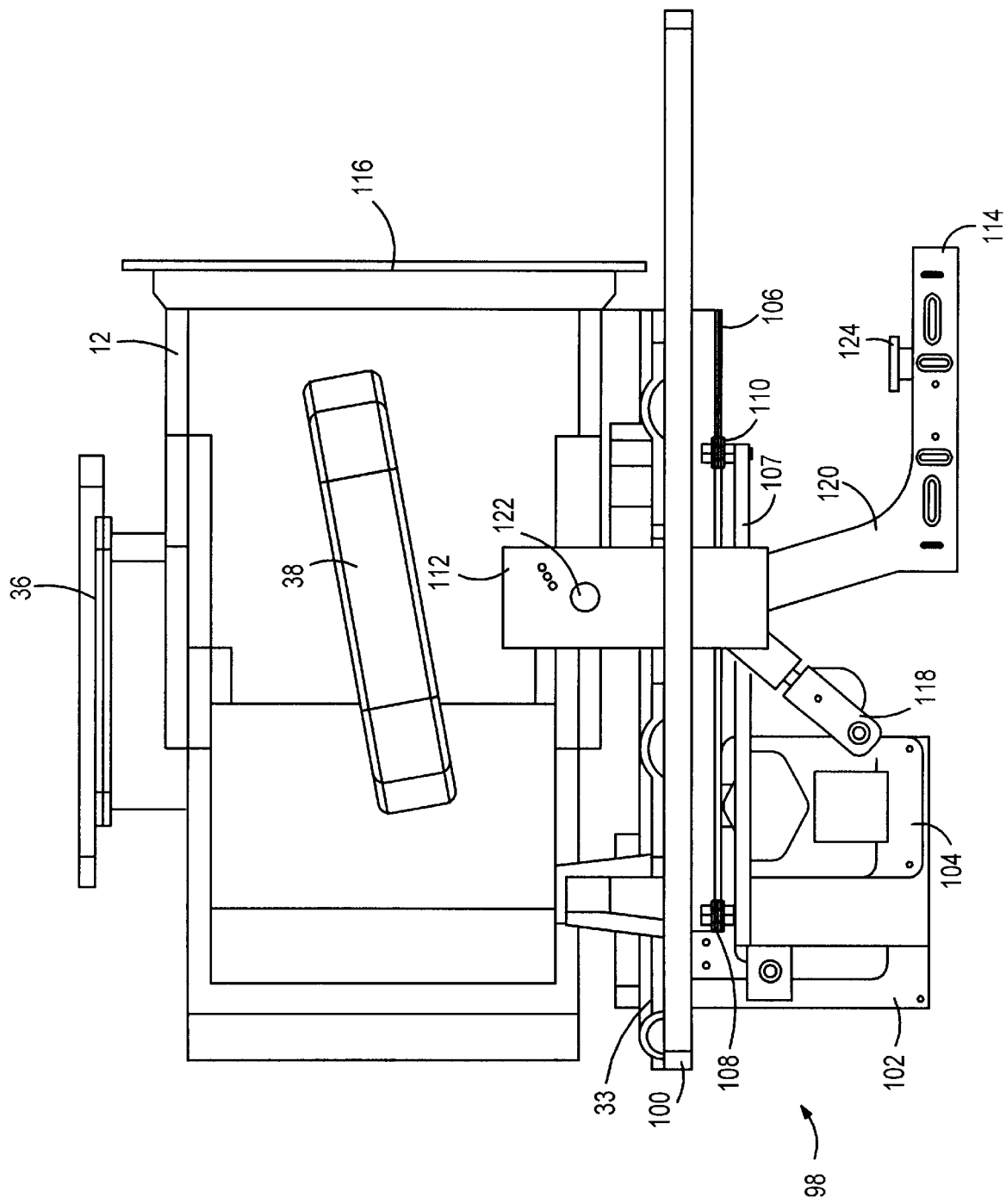
FIG. 3 is a side view of a more complex door removal system in accordance with the invention.

A more complex automated pod door removal system 98 is shown in side view in FIG. 3. The pod 12 is secured to a base plate 100 using kinematic coupling, as is well known in the art. However, the use of kinematic coupling is not critical to the invention. The door removal system 98 includes an X-axis motor 102 that is only partially visible, since a rotational motor 104 is located in front of the X-axis motor in the perspective of FIG. 3. The X-axis motor controls movement of a displaceable plate 107 to which the rotational motor 104 is affixed. The displaceable plate 107 moves relative to the base plate 100. A track 106 is affixed to the base plate, while guide wheels 108 are attached to the displaceable plate 107. Thus, the operation of the X-axis motor 102 causes movement of the guide wheels 108 along the track 106.

A mount 112 is connected to the displaceable plate 107, so that the X-axis motor 102 controls linear movement of the mount 112. A door-contacting assembly 114 is rotatably attached to the mount 112. Consequently, the door-contacting assembly is able to move away from and toward the motor 102. The assembly 114 is shown in a rest position in FIG. 3. In this rest position, the assembly is horizontally oriented.

In order to remove a door 116 from the pod 12, the door-contacting assembly 114 is rotated 90° counterclockwise, as viewed in FIG. 3. Rotational links 118 are controlled by the rotational motor 104 to cause side arms 120 to rotate the door-contacting assembly 114 about a pivot point 122 of the mount 112. When the assembly 114 reaches a position in which it is parallel with the door 116 of the pod, the X-axis motor 102 moves the assembly into engagement with the door. As previously noted, the assembly may include keys 124 that are actuated to unlatch the door 116. For example, the keys may be rotated by solenoid action.

After the door 116 of the pod 12 has been unlatched, the X-axis motor 102 moves the assembly and door away from the remainder of the pod. The assembly and door are then rotated 90° clockwise by the rotational motor 104 until the assembly returns to the horizontal orientation shown in FIG. 3. Optionally, the X-axis motor 102 may be used to move the door to a fully protected position beneath the pod 12.

Figure 4:
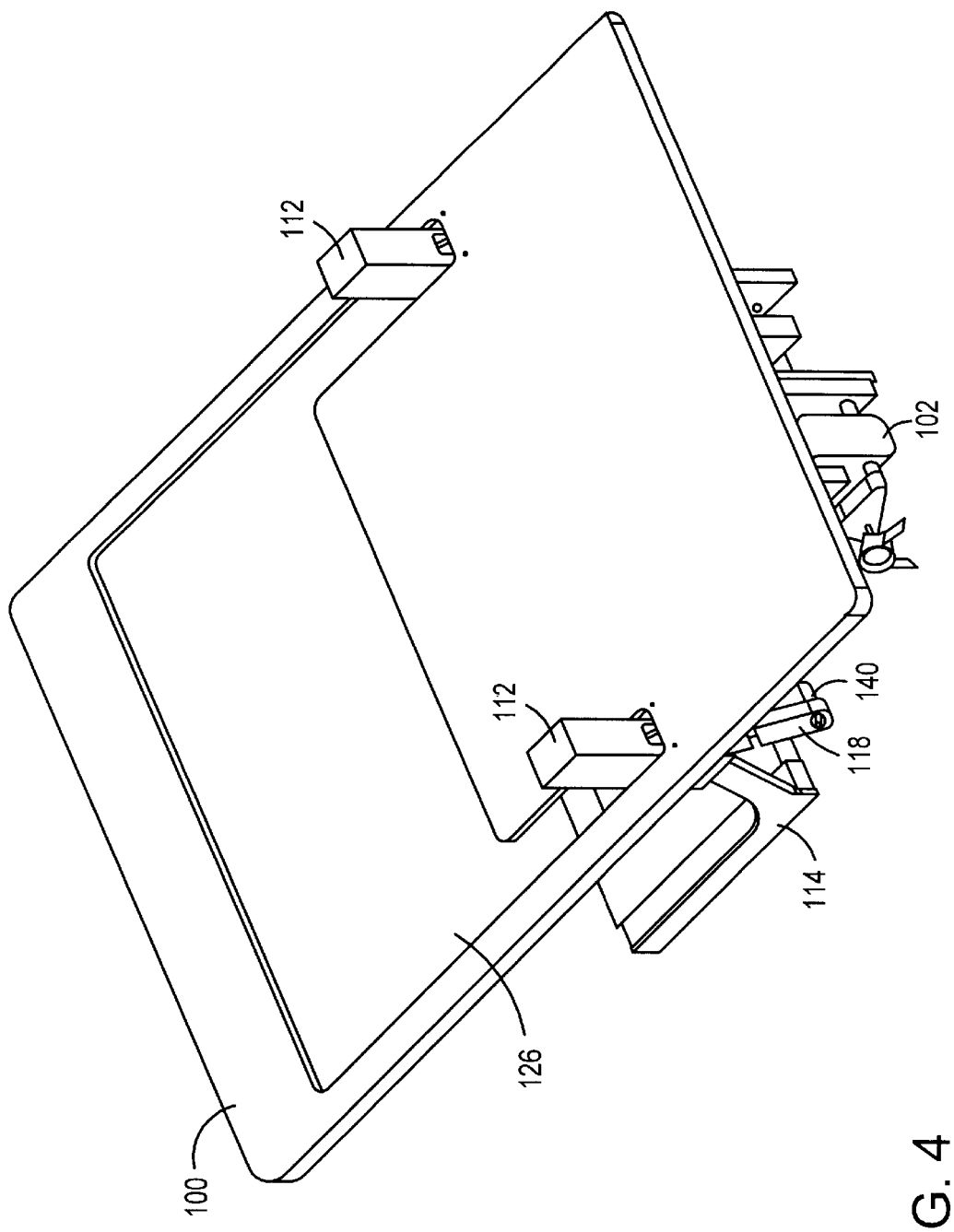
FIG. 4 is a perspective view of the system of FIG. 3.

The configuration of the base plate 100 is shown more clearly in FIG. 4. The base plate includes an opening 126 through which the door-contacting assembly 114 is pivoted. The pod is fixed at the solid portion of the base plate 100 behind the opening 126. The structure for kinematically coupling the pod to the base plate is not shown in FIG. 4.

Figure 5:
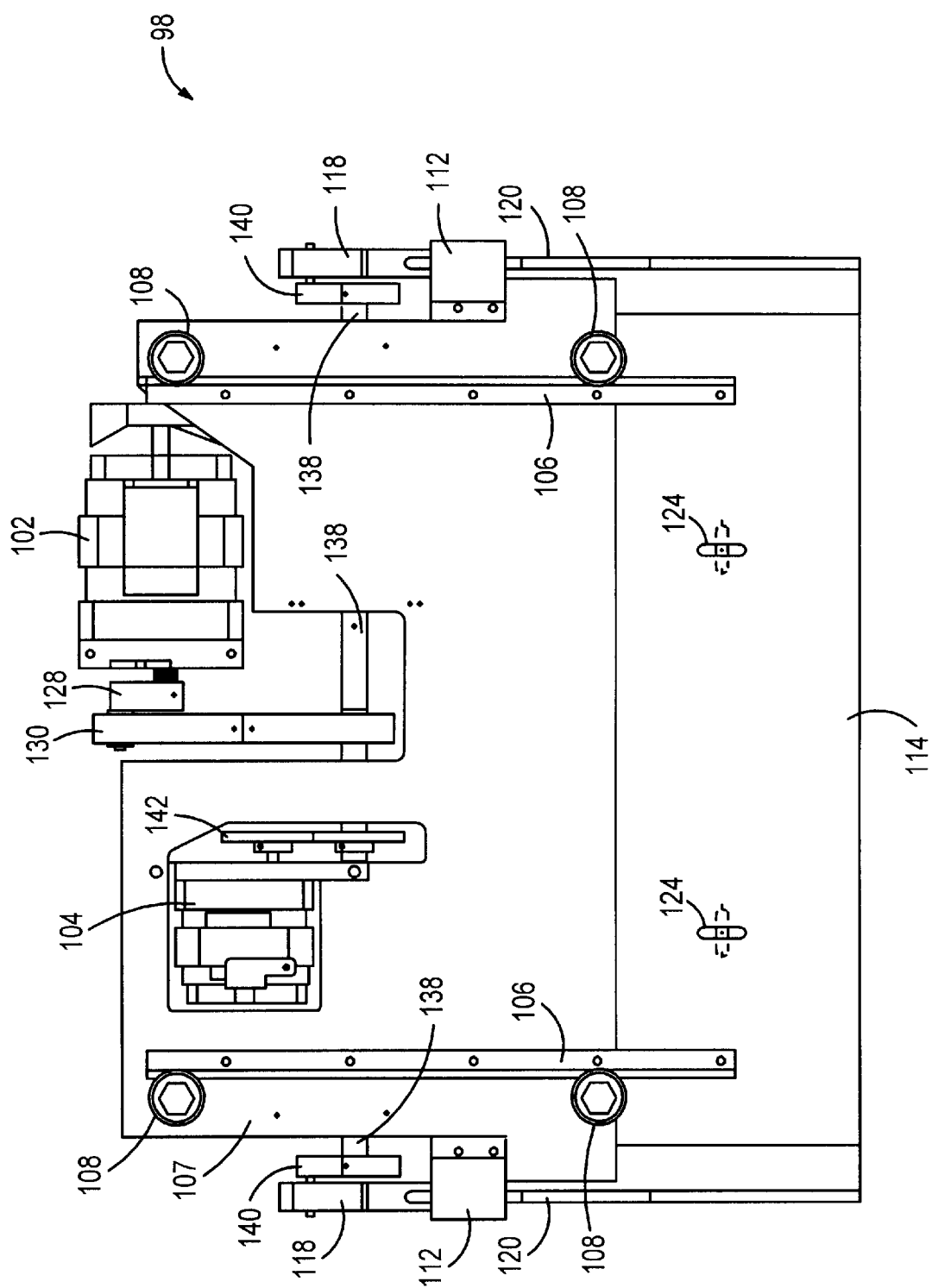
FIG. 5 is a top view of the system of FIG. 4.

FIG. 5 is a top view of the automated pod door removal system 98, with the base plate removed. As previously noted, the tracks 106 are fixed in position. Guide wheels 108 ensure a smooth linear motion of the displaceable plate 107 when the X-axis motor 102 is actuated. The X-axis motor is also fixed relative to the base plate. Operation of the motor 102 causes rotation of an X-axis eccentric 128 that is connected to an X-axis link 130. In turn, the link 130 is connected to a drive shaft 138 that is fixed relative to the displaceable plate 107. When the X-axis motor 102 turns the eccentric 128, the link 130 is pushed or pulled, depending upon the direction of rotation by the motor. As a result, the displaceable plate 107 and the components connected to the displaceable plate are moved forwardly or rearwardly relative to the motor 102 and the tracks 106. In the top view of FIG. 5, the keys 124 are shown in one position by the use of solid lines and are shown in a second position by dashed lines.

Figure 6:
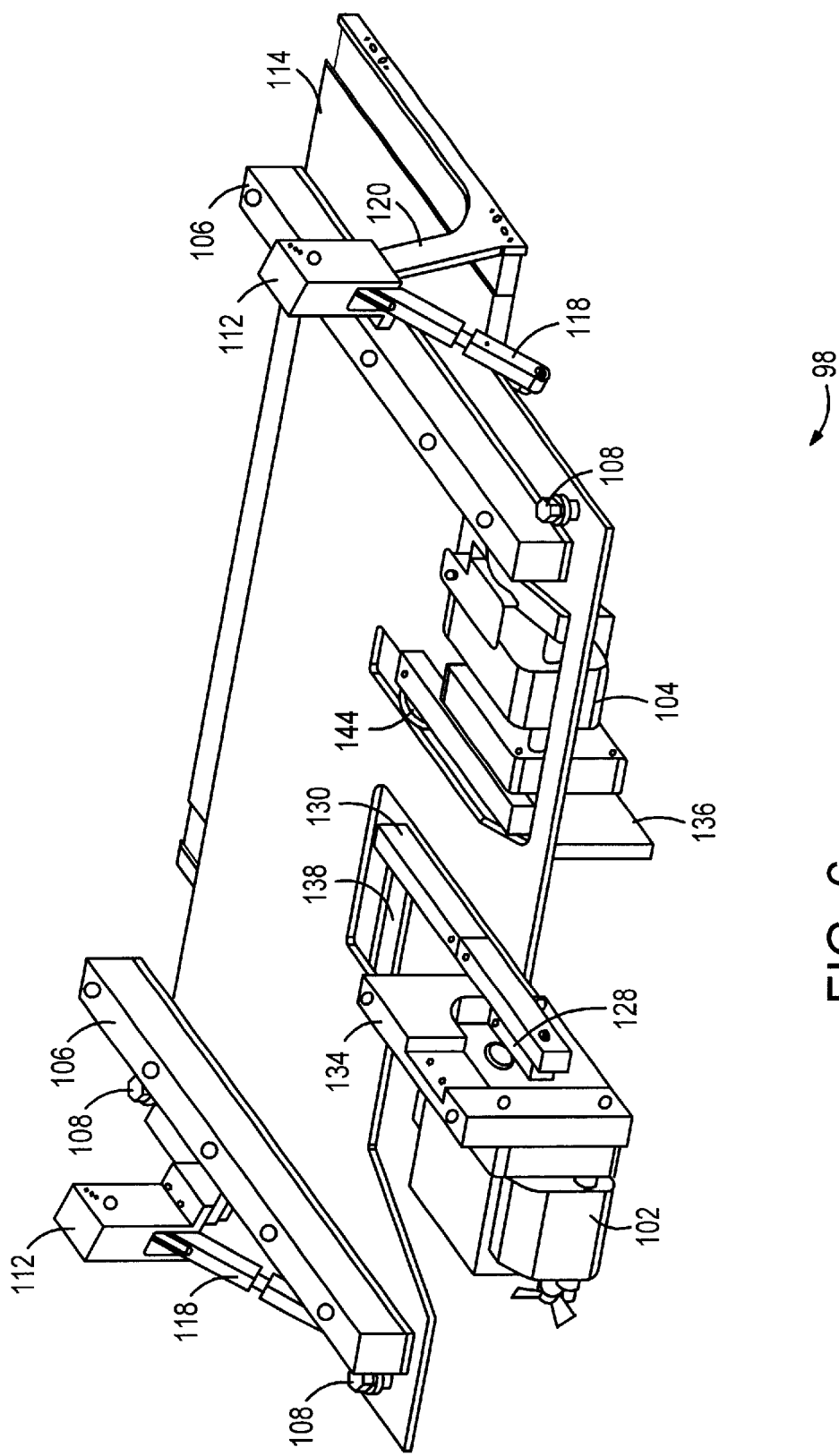
FIG. 6 is a perspective view of the system of FIG. 5, without a base plate.

The various components of FIG. 5 are shown in perspective in FIG. 6. The X-axis motor 102 is fixed to the base plate, not shown, by a motor mount 134. On the other hand, rotational motor 104 is fixed to the displaceable plate 107 by a motor mount 136.

Figure 7:
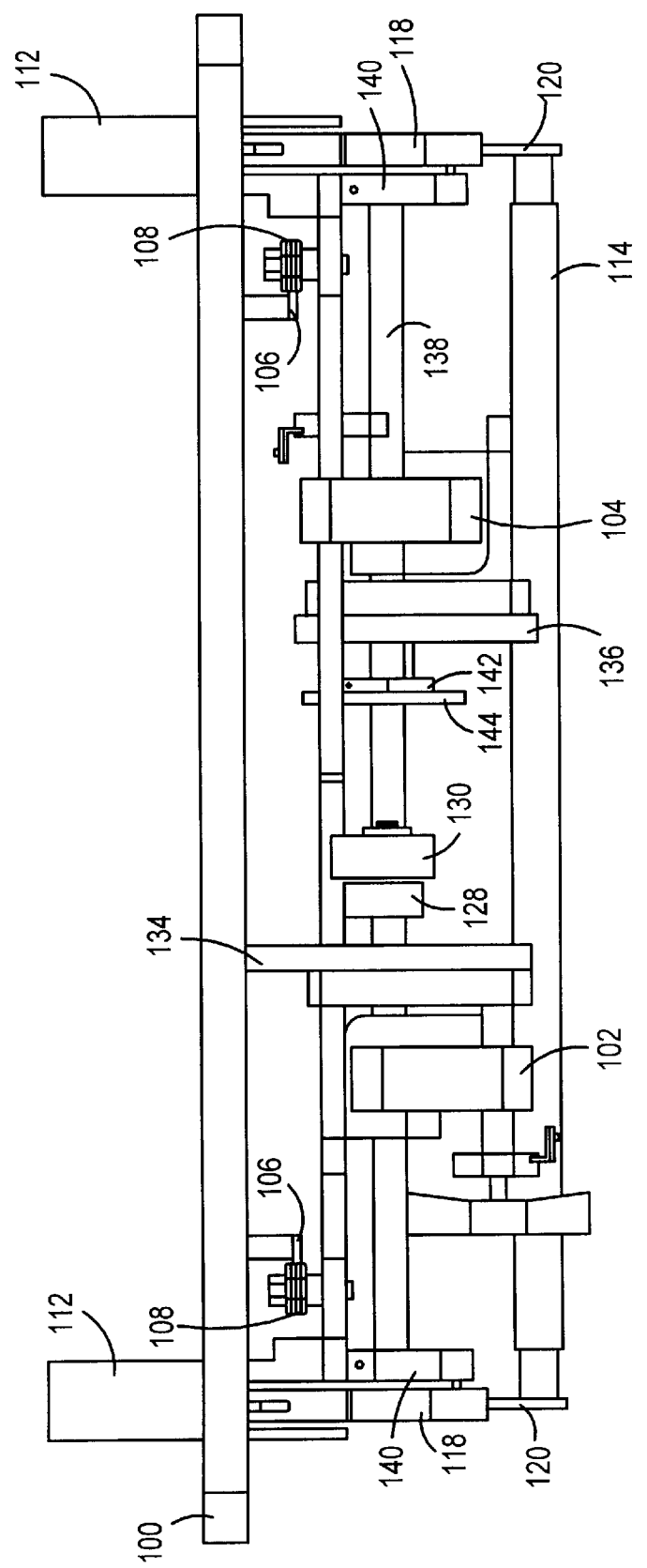
FIG. 7 is a rear view of the system of FIG. 3.

A rear view of the system 98 is shown in FIG. 7. The 90° pivoting of the door-contacting assembly 114 is accomplished by utilizing the rotational motor 104 to rotate the drive shaft 138 that extends between rotational eccentrics 140. The coupling of the eccentrics 140 to the drive shaft 138 and to the rotational links 118 may be seen more clearly in FIG. 5. When the drive shaft is rotated, the eccentrics 140 are turned, causing displacement of the links 118. The links are connected to rotate the side arms 120 of the door-contacting assembly 114 such that the assembly is rotated around the pivot points of the mounts 112. The motor turns a first gear 142 that drives a second gear 144 which is coupled to the drive shaft 138.

Figure 8:
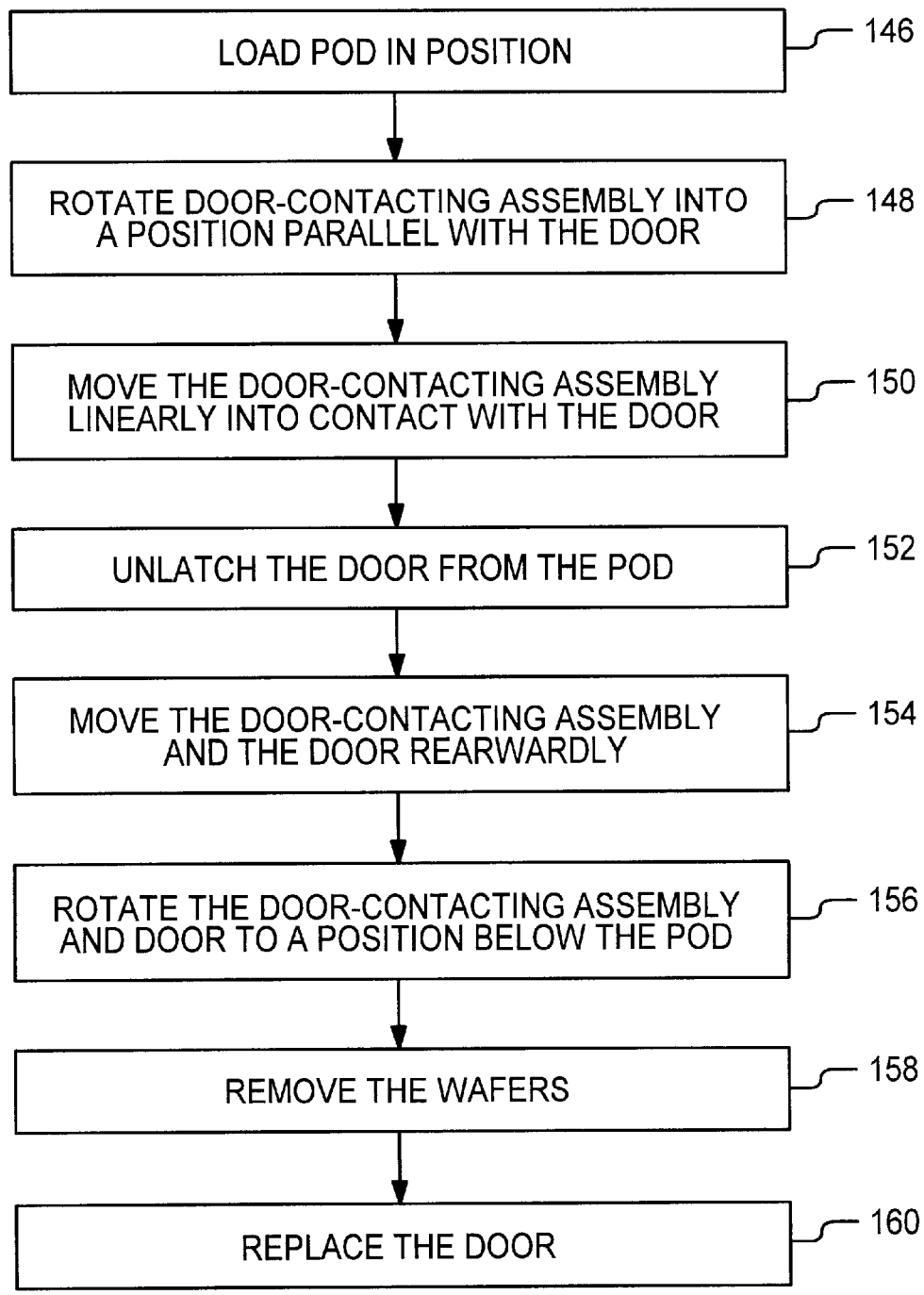
FIG. 8 is a process flow of steps for utilizing the system of FIG. 1 in accordance with the invention.

FIG. 8 identifies the steps involved in implementing the stages of operation of the wafer transfer system 10 of FIG. 1. However, it should be noted that the automated door removal system may be used in other applications. In step 146, the pod 12 of FIG. 1 is loaded into position. That is, the pod is secured in the seating region of the base unit 18. In step 148, the door-contacting assembly is caused to rotate from its horizontal rest position into a position parallel with the door of the pod. Then, the door-contacting assembly is moved linearly in step 150 so as to contact the door to be removed.

The contact of the door-contacting assembly with the door causes the unlatching mechanism to be activated at step 152. As previously noted, the unlatching mechanism may include electrically activated keys that release the door from the pod when the keys are rotated by 90°. In step 154, the door-contacting assembly and the released door are moved rearwardly. The step 154 is the reverse of step 150. Likewise, the step 156 of rotating the door-contacting assembly and the released door is the inverse of the rotation step 148. Preferably, the home position at the completion of step 156 is the rest position immediately below the pod 12 of FIG. 1, so that the door is in a protected position below the pod.

The wafers within the pod 12 can then be removed, as indicated at step 158. In FIG. 1, the wafer handling device 12 includes pairs of parallel support rods that pick up the individual wafers stored within the pod. The wafer transfer device travels along rails to extend the rods into the pod 12. The pitch of the support rods is equal to the pitch of the wafers within the pod. This allows the wafer transfer device to remove all the semiconductor wafers contained within the pod. In FIG. 1, the wafer transfer device is rotatable to allow the removed wafers to be inserted into the cassette. The cassette includes comb-like structures that define slots having a pitch compatible with the pitch of the support rods. Consequently, the wafers can be easily moved from the pod 12 to the cassette 16.

Finally, in step 160, the door is replaced and locked into position on the pod 12. The door-contacting assembly follows the rotation and linear movement steps 148, 150, 154 and 156, but the unlatching step 152 is substituted with a step of latching the door onto the pod. When the door-contacting assembly is returned to its rest position below the pod, the cassette 16 and the pod 12 can be removed. While the process flow of the steps of FIG. 8 have been described with reference to transferring wafers from the pod 12 to the cassette 16, the steps would apply equally to the reverse process or to any process in which the wafers are removed from the pod.

In another embodiment, the rotation of the door-contacting assembly at step 148 is implemented by mounting the assembly to a track or other mechanism that defines an arcuate path that is followed by the assembly. Thus, by applying a forward or rearward drive to the door-contacting assembly, the assembly is caused to follow the fixed arcuate path.

What is claimed is:

1. An automated door removal and replacement system for a fabrication facility comprising:
    means for securing a disk-supporting device in a substantially fixed position such that a door of said device has a particular orientation;
    a door-contacting assembly having a rest position below a level of said device when said device is in said substantially fixed position;
    rotation means for rotating said door-contacting assembly between said rest position below said level of said device and a second position adjacent to said door having said particular orientation; and
    linear means for linearly displacing said door-contacting assembly between said second position and a third position in engagement with said door when said device is in said substantially fixed position;
    wherein combined rotation and linear movement of said door-contacting assembly moves said door between said particular orientation in contact with said device and said rest position of said door-contacting assembly below said level of said device.

2. The system of claim 1 wherein said rotation means includes a first motor and said linear means includes a second motor.

3. The system of claim 1 wherein said means for securing a device is configured to position a Front Opening Unified Pod (FOUP).

4. The system of claim 1 wherein said means for securing is configured to position said door in a substantially vertical orientation and wherein said rotation means defines said rest position such that said door-contacting assembly has a substantially horizontal orientation.

5. The system of claim 1 wherein said door-contacting assembly includes an unlatching mechanism for releasing said door from said device.

6. The system of claim 5 wherein said unlatching mechanism is an electrically activated mechanism.

7. The system of claim 1 wherein said rotation means includes a motor drive that positions said door directly below said device when said door-contacting assembly carries said door to said rest position.

8. The system of claim 7 wherein said means for securing includes a base plate having an opening for passage of said door-contacting assembly.

9. A system for transferring wafers comprising:
    a base having a pod region configured to seat a wafer pod having a removable door;
    a wafer handling device adjacent to said pod region to selectively extend into said wafer pod when said door is removed;
    a door-engagement mechanism configured to engage said door;
    a rotary device connected to said door-engagement mechanism to rotate said door-engagement mechanism relative to said pod region, said door-engagement mechanism being rotated from a first position that is below said pod region to a second position in which said door-engagement mechanism is aligned with said door that is above said first position; and
    a linear device connected to said door-engagement mechanism to linearly displace said door-engagement mechanism between said second position and a condition in contact with said door.

10. The system of claim 9 wherein said base includes an opening, said rotary device being positioned to rotate said door-engagement mechanism through said opening.

11. The system of claim 10 wherein said pod region of said base is configured to secure a FOUP.

12. The system of claim 9 wherein said rotary device and said linear device include independent first and second motors.

13. The system of claim 9 wherein said door-engagement mechanism includes electrically activated members positioned to unlatch said door from said wafer pod.

14. An automated door removal and replacement system for a fabrication facility comprising:
    means for securing a disk-supporting device in a substantially fixed position such that a door of said device has a particular orientation;
    a door-contacting assembly having a rest position below a level of said device when said device is in said substantially fixed position;
    means for maneuvering said door-contacting assembly such that said door-contacting assembly follows the sequence of:
        (a) being rotated between said rest position and a second position adjacent to said door having said particular orientation; and
        (b) being linearly displaced between said second position and a third position in engagement with said door when said device is in said substantially fixed position;
    wherein combined rotation and linear movement of said door-contacting assembly moves said door between said particular orientation in contact with said device and said rest position of said door-contacting assembly.

* * * * *